United States Patent
Lee et al.

(10) Patent No.: US 6,542,956 B1
(45) Date of Patent: *Apr. 1, 2003

(54) LATCHED ADDRESS MULTI-CHUNK WRITE TO EEPROM

(75) Inventors: Douglas J. Lee, San Jose, CA (US); Mehrdad Mofidi, Fremont, CA (US); Sanjay Mehrotra, Milpitas, CA (US); Raul-Adrian Cernea, Cupertino, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/642,880

(22) Filed: Aug. 21, 2000

Related U.S. Application Data

(63) Continuation of application No. 09/226,405, filed on Jan. 6, 1999, now Pat. No. 6,157,983, which is a continuation of application No. 08/743,857, filed on Nov. 5, 1996, now Pat. No. 5,890,192.

(51) Int. Cl.[7] .......................... G06F 12/00; G11C 16/00
(52) U.S. Cl. .................... 711/103; 365/189.05; 365/222
(58) Field of Search ................ 711/100, 102, 711/103, 154; 365/120, 189.05, 222

(56) References Cited

U.S. PATENT DOCUMENTS

| | | | |
|---|---|---|---|
| 4,578,751 A | * | 3/1986 | Erwin .................. 711/103 |
| 4,715,017 A | | 12/1987 | Iwahashi |
| 4,931,999 A | | 6/1990 | Umeki |
| 5,043,940 A | | 8/1991 | Harari |
| 5,163,021 A | | 11/1992 | Mehrotra et al. |
| 5,168,468 A | | 12/1992 | Magome et al. |
| 5,172,338 A | * | 12/1992 | Mehrotra et al. ...... 365/185.03 |
| 5,289,429 A | | 2/1994 | Watanabe |
| 5,297,148 A | | 3/1994 | Harari et al. |
| 5,301,162 A | | 4/1994 | Shimizu |
| 5,396,468 A | | 3/1995 | Harari et al. |
| 5,422,842 A | | 6/1995 | Cernea et al. |
| 5,430,859 A | | 7/1995 | Norman et al. |
| 5,530,955 A | | 6/1996 | Kaneko |
| 5,606,532 A | * | 2/1997 | Lambrache et al. ..... 365/238.5 |
| 5,691,954 A | | 11/1997 | Ooishi |
| 5,765,185 A | * | 6/1998 | Lambrache et al. ........ 711/103 |
| 5,845,313 A | | 12/1998 | Estakhri et al. ............. 711/103 |
| 6,044,019 A | * | 3/2000 | Cernea et al. ......... 365/185.21 |

* cited by examiner

Primary Examiner—Tuan V. Thai
(74) Attorney, Agent, or Firm—Skjerven Morrill LLP

(57) ABSTRACT

An EEPROM system includes flash EEPROM cells organized into subarrays. Pairs of subarrays share row address decoders by sharing word lines, and individual subarrays have dedicated column address decoders and data registers. Each row decoder has an associated row address latch, and each column decoder has an associated column address latch. Multiple data chunks are concurrently written into the subarrays by first latching chunk addresses into the row and column address latches, and corresponding chunks of data into the data registers, then activating a programming signal to initiate concurrent programming and verifying the programming of the data chunks.

12 Claims, 9 Drawing Sheets

LATCHED ADDRESS MULTI-CHUNK WRITE TO EEPROM

This is a continuation of application Ser. No. 09/226,405, filed Jan. 6, 1999, now U.S. Pat. No. 6,157,983 which in turn is a continuation of Ser. No. 08/743,857, filed Nov. 5, 1996, now U.S. Pat. No. 5,890,192.

FIELD OF THE INVENTION

This invention relates in general to data write circuits for memory devices and in particular, to a multi-chunk data write circuit and method for concurrently writing more than one addressable chunk of data at a time to an electrically-erasable and programmable read-only memory (EEPROM).

BACKGROUND OF THE INVENTION

In a conventional EEPROM, data is written one addressable data chunk at a time. Accordingly, a multi-chunk write operation includes several repetitions of providing an address and a data chunk to be written at that address, then programming and verifying the programming of the data chunk into that address. Since the time for programming and verifying the programming of each chunk of data generally far exceeds the time required for providing the address and the data for each chunk of data, such multi-chunk write operations in a conventional EEPROM tend to be very slow.

OBJECTS AND SUMMARY OF THE INVENTION

Accordingly, it is an object of the present invention to provide a multi-chunk write circuit and method for performing multi-chunk write operations to an EEPROM in a significantly faster manner than conventional EEPROM write circuits and methods.

This and additional objects are accomplished by the various aspects of the present invention, wherein briefly stated, one aspect is a multi-chunk write circuit which concurrently writes and verifies the writing of multiple chunks of data at a time into an EEPROM, thereby performing multi-chunk write operations significantly faster than conventional EEPROM write circuits which sequentially write a chunk of data at a time into an EEPROM.

Another aspect is a circuit for concurrently writing data into selected ones of a plurality of subarrays of EEPROM cells. Included in the circuit are means for storing a plurality of addresses indicative of locations in the plurality of subarrays of EEPROM cells; a plurality of data registers coupled to the plurality of subarrays of EEPROM cells; and means for sequentially storing addresses into the storing means and corresponding data into the plurality of data registers, and concurrently writing the data stored in the plurality of data registers into the locations in the plurality of subarrays corresponding to the stored addresses.

In another aspect, a method of concurrently writing a plurality of data chunks into an EEPROM, comprises the steps of: sequentially storing the plurality of data chunks into a plurality of data storage means respectively coupled to corresponding subarrays of the EEPROM; providing row and column select signals to row and column decoder means coupled to the corresponding subarrays of the EEPROM; and concurrently writing the plurality of data chunks stored in the plurality of data storage means into the corresponding subarrays of the EEPROM as indicated by the row and column select signals.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENTS

In a prior art flash EEPROM device, multiple data chunks are written sequentially into the EEPROM device. For each chunk of data, a full write sequence is performed comprising the steps of providing a chunk address indicating a location in the EEPROM device where the chunk of data is to be written, providing data to be written into the location indicated by the chunk address, providing a program command ordering write circuitry in the EEPROM device to write the provided chunk of data into the location indicated by the chunk address, and waiting for the chunk of data to be programmed and verified before writing a next chunk of data into the EEPROM device.

Figure 1:
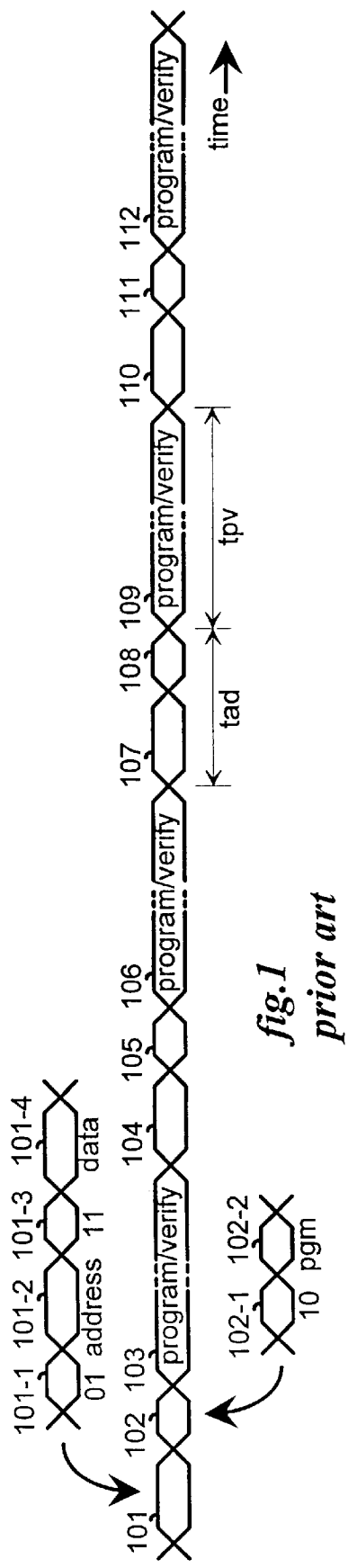
FIGS. 1 and 2 illustrate, as comparative examples, timing diagrams for a prior art multiple chunk write operation, and a multi-chunk write operation utilizing aspects of the present invention.

FIG. 1 illustrates, as an example, a timing diagram for a multi-chunk write operation performed on such a prior art flash EEPROM device. For a first chunk of data to be written, address and data information 101 including a first chunk address 101-2 and the first chunk of data 101-4 are provided to the EEPROM device. The chunk address 101-2 corresponds to an address in the EEPROM device wherein the first chunk of data is to be written, and the chunk data 101-4 are the data to be written into that address location.

Preceding the chunk address 101-2 is a serial protocol operator 101-1 indicating that a chunk address follows, and preceding the chunk of data 101-4 is another serial protocol operator 101-3 indicating that a chunk of data follows. Following the address and data information 101 is a program command 102-2 ordering write circuitry in the EEPROM device to write the first chunk of data 101-4 into the chunk location having address 101-2. Preceding the program command 102-2 is another serial protocol operator 102-1 indicating that a command follows. Following the program command 102-2 is a period of time 103 during which the first chunk of data is programmed and verified. Similar sequences for writing second, third and fourth chunks of data are also shown. A period of time "tpv" is consumed during which each chunk of data is being programmed and verified, which is generally much longer than a period of time "tad" required for latching the chunk address and the data chunk to be programmed.

In contrast, in an EEPROM device (or chip) utilizing aspects of the present invention, multiple data chunks are written concurrently into the EEPROM device. Chunk address and data information for each of the multiple data chunks is first provided to corresponding latches in the EEPROM device, followed by a program command ordering write circuitry in the EEPROM device to concurrently write the provided chunks of data into the locations indicated by the chunk addresses, which in turn, is followed by a single wait period for the multiple data chunks to be concurrently programmed and verified before writing a next multiple data chunks into the EEPROM device. Since only a single program/verify wait period is incurred in this multi-chunk write operation, it is performed considerably faster than the prior art multi-chunk write operation described in reference to FIG. 1, wherein multiple program/verify wait periods are incurred.

Figure 2:
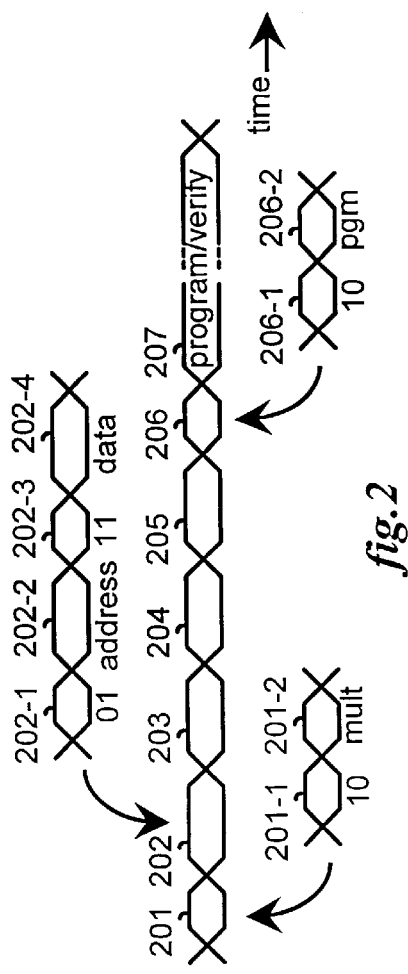

FIG. 2 illustrates, as an example, a timing diagram for a multi-chunk write operation performed on such an EEPROM device utilizing aspects of the present invention. The multi-chunk write operation is initiated by a multi-chunk write command 201-2, preceded by a serial protocol operator 201-1 indicating that a command follows. Address and data information 202, 203 204 and 205 are then provided for each of the multiple data chunks to be concurrently programmed and verified. Each address and data information, such as address and data information 202 for a first data chunk, includes a chunk address 202-2 preceded by a serial protocol operator 202-1 indicating that a chunk address follows, and a chunk of data 202-4 preceded by a serial protocol operator 202-3 indicating that a chunk of data follows. After latching the address and data information for the multiple data chunks into respective latches of the EEPROM device, a program command 206-2 is provided ordering write circuitry in the EEPROM device to concurrently write the provided chunks of data into the locations indicated by the chunk addresses. A single wait period is then incurred for the multiple data chunks to be concurrently programmed and verified before writing a next multiple data chunks into the EEPROM device.

Figure 3:
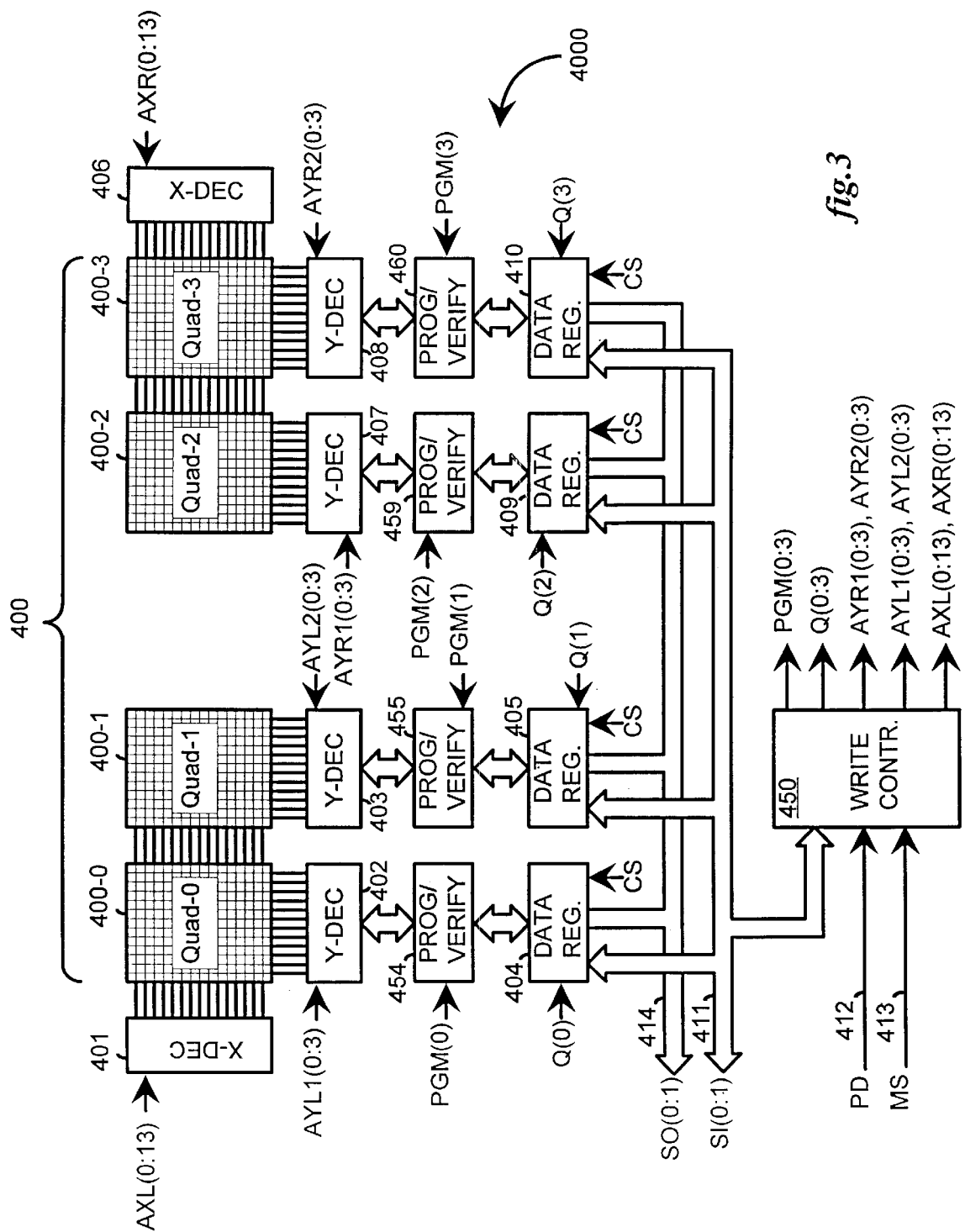
FIG. 3 illustrates, as an example, a block diagram of an EEPROM system utilizing aspects of the present invention.

FIG. 3 illustrates, as an example, a block diagram of an EEPROM system 4000 formed on an EEPROM chip and including a plurality of flash EEPROM cells 400 organized into four subarrays or quadrants, 400-0 to 400-3. In the preferred embodiment, each subarray or quadrant comprises up to 16K addressable rows of up to 16 addressable data chunks. Each data chunk includes a plurality of bits, such as 64 bits, which are communicated as an addressable unit to the EEPROM system 4000 via a 2-bit wide serial input bus SI(0:1) 411, or from the EEPROM system 4000 via a 2-bit wide serial output bus SO(0:1) 414. Each flash EEPROM cell may also include a plurality of bits, such as 2 or 4, if multi-state memory cells are employed.

A left row decoder (X-DEC) 401 decodes row addresses for quadrants 400-0 and 400-1, which share the left row decoder 401 by sharing word lines, and a right row decoder (X-DEC) 406 decodes row addresses for quadrants 400-2 and 400-3, which share the right row decoder 406 by also sharing word lines. The left row decoder 401 receives row addresses via left internal row address lines AXL(0:13) from a write control logic circuit 450 to decode up to 16K rows, and the right row decoder 406 receives row addresses via right internal row address lines AXR(0:13) from the write control logic circuit 450 to also decode up to 16K rows. Although addressing flexibility is improved by providing each quadrant with its own row decoder, The sharing of a row decoder by two quadrants considerably reduces the required row decoder circuitry and concomitant routing lines in the preferred embodiment.

First, second, third, and fourth column decoder and sense amplifier circuits (Y-DEC) 402, 403, 407, and 408 are respectively coupled to first, second, third, and fourth quadrants 400-0, 400-1, 400-2, and 400-3 to decode column chunk addresses, and transmit data to and from locations corresponding to the column chunk addresses and row addresses received by their respective row decoders. The first column decoder and sense amplifier circuit 402 receives column chunk addresses via first left internal column address lines AYL1(0:3) from the write control logic circuit 450 to decode up to 16 chunk columns, the second column decoder and sense amplifier circuit 403 receives column chunk addresses via second left internal column address lines AYL2(0:3) from the write control logic circuit 450 to decode up to 16 chunk columns, the third column decoder and sense amplifier circuit 407 receives column chunk addresses via first right internal column address lines AYR1(0:3) from the write control logic circuit 450 to decode up to 16 chunk columns, and the fourth column decoder and sense amplifier circuit 408 receives column chunk addresses via second right internal column address lines AYR2(0:3) from the write control logic circuit 450 to decode up to 16 chunk columns.

First, second, third, and fourth data registers (DATA REG.) 404, 405, 409, and 410 are each coupled to the serial input bus 411 and the serial output bus 414, and respectively coupled to the first, second, third, and fourth column decoder and sense amplifier circuits 402, 403, 407, and 408 respectively through first, second, third, and fourth program/verify circuits 454, 455, 459, and 460. Each of the data registers 404, 405, 409, and 410 stores up to a chunk of data which is to be programmed into or is read from their respective quadrants.

When a multi-chunk write operation is being performed, the chunks of data are first sequentially latched into the data registers 404, 405, 409, and 410, in response to latch enable signals Q(0), Q(1), Q(2), and Q(3) provided by the write control logic circuit 450, and control signals CS provided, for example, by a serial protocol logic circuit (not shown) included in an EEPROM device along with the EEPROM system 4000. The control signals CS include, as examples, a read/program signal which indicates whether data is being read from or written to the quadrants 400-0 to 400-3, a program data signal (PDAT) which indicates that a chunk of data is ready to be received via the serial input bus 411, and a clock signal for serially loading the data from the serial input bus 411 into an enabled one of the first, second, third, and fourth data registers 404, 405, 409, and 410.

After latching the chunks of data into the data registers 404, 405, 409, and 410, programming and verifying the programming of the latched data is performed under the control of the program/verify circuits 454, 455, 459, and 460 in response to activation of program enable lines PGM(0), PGM(1), PGM(2), and PGM(3) provided by the write control logic circuit 450, so that a series of program/verify steps are performed until all bits of the data chunks being programmed and verified in parallel are programmed and verified as having been programmed correctly.

The write control logic circuit 450 is coupled to the serial input bus SI(0:1) 411, control signal line PD 412, and multi-chunk program line MS 413 to activate program enable lines PGM(0:3) for column decoder and sense amplifier circuits 402, 403, 407, and 408, data register enable signals Q(0:3) for data registers 404, 405, 409, and 410, first and second right internal column address lines, AYR1(0:3) and AYR2(0:3), for column decoder and sense amplifier circuits, 407 and 408, first and second left internal column address lines, AYL1(0:3) and AYL2(0:3), for column decoder and sense amplifier circuits, 402 and 403, and left and right internal row address lines, AXL(0:13) and AXR (0:13), for left and right row decoders, 401 and 406.

For additional details on a serial protocol logic link such as employed in communicating with the EEPROM system 4000, see U.S. Pat. No. 5,430,859, which is incorporated herein by this reference, and describes a flash EEPROM device employing a serial protocol link to communicate with the flash EEPROM device. For additional details on the structure and operation of program/verify circuits such as program/verify circuits 454, 455, 459, and 460, see U.S. Pat. No. 5,172,338, which is incorporated herein by this reference, and describes certain write circuits and techniques for programming a chunk of data at a time into a flash EEPROM device.

Figure 4:
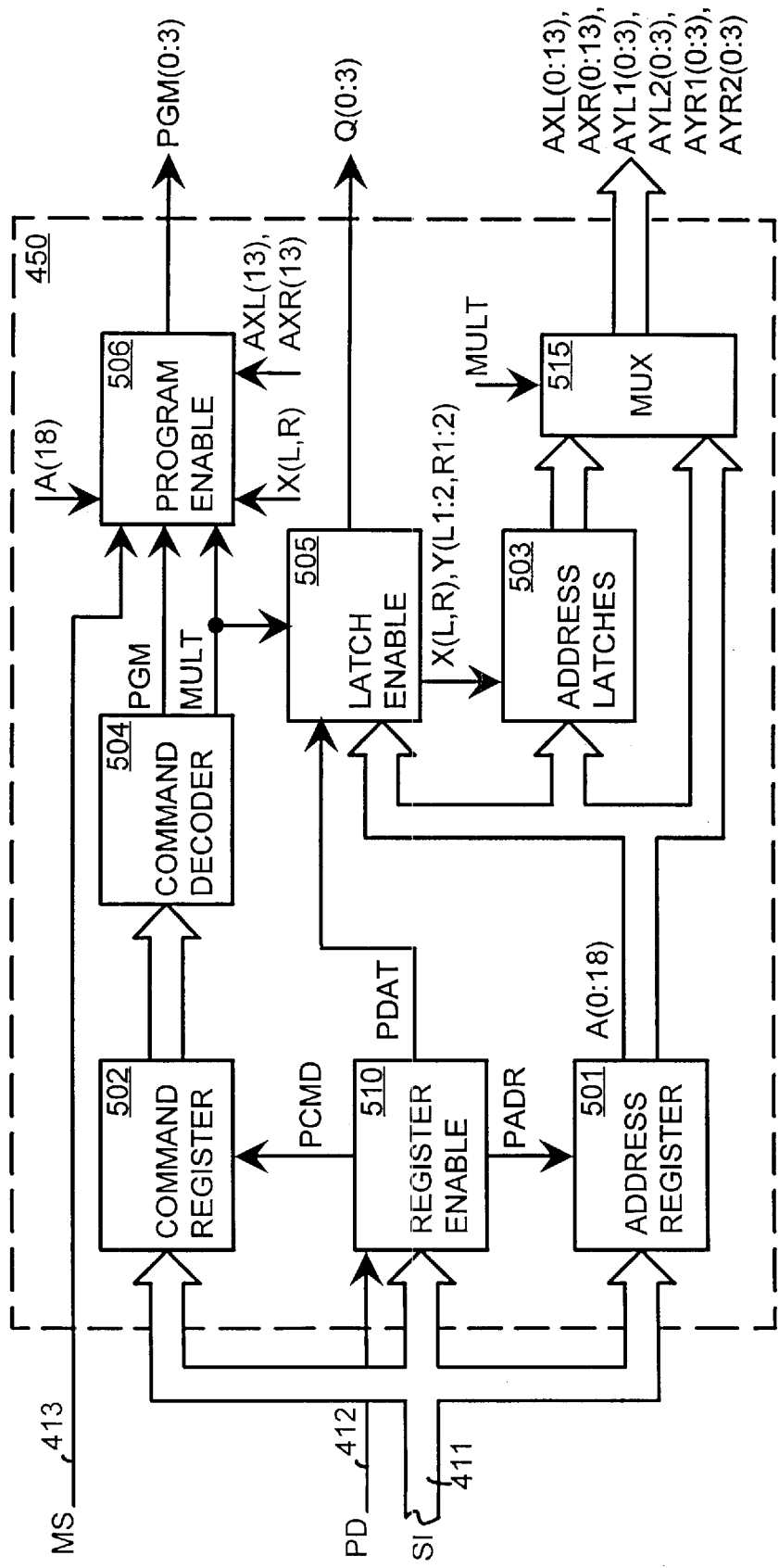
FIG. 4 illustrates, as an example, a block diagram of the write control logic of FIG. 3, utilizing aspects of the present invention.
Figure 5:
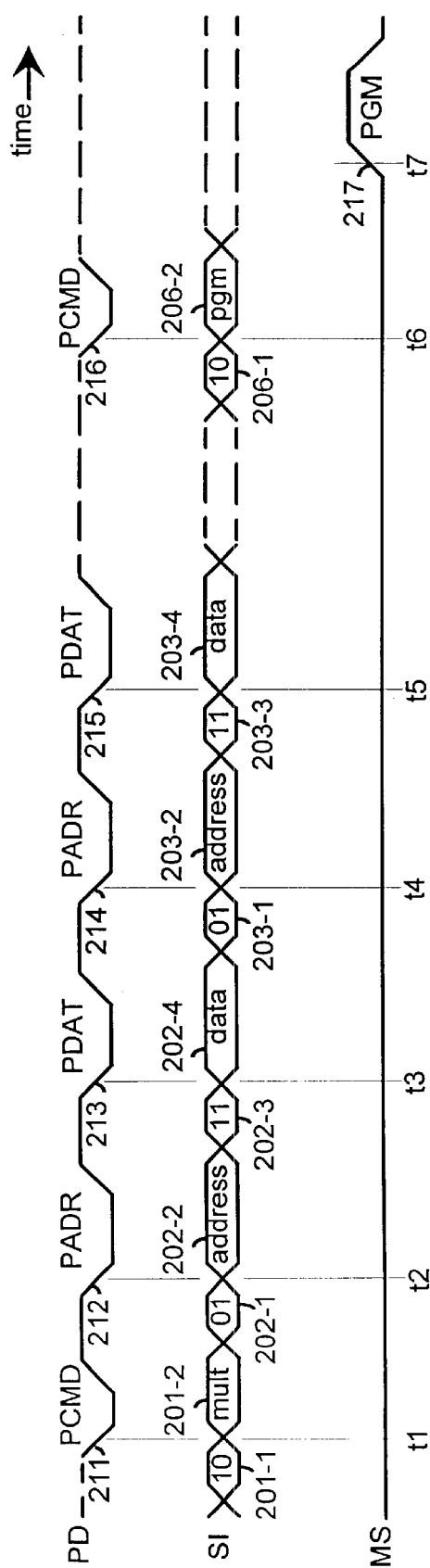
FIG. 5 illustrates, as an example, timing diagrams for a serial input (SI) signal and associated control signals (PD and MS) provided to the write control logic of FIG. 4, utilizing aspects of the present invention.

FIGS. 4 and 5 respectively illustrate, as examples, a block diagram detailing the structure of the write control logic circuit 450, and timing diagrams useful for describing the operation of the write control logic circuit 450. Referring first to FIG. 4, a register enable circuit 510 has inputs coupled to the serial input bus 411 and to the control signal line PD 412, and outputs coupled to an address register 501, command register 502, and latch enable circuit 505 of the write control logic circuit 450. Referring next to FIG. 5, the register enable circuit 510 first receives the serial protocol operator 201-1 having the bit code "10" which indicates that a command follows. In response, the register enable circuit 510 activates an enable line PCMD at a falling edge 211 of the control signal line PD 412, which causes a multi-chunk write command 201-2 following the serial protocol operator 201-1 on the serial input bus SI(0:1) 411 to be latched into a command register 502 at time t1. A command decoder 504 coupled to the command register 502, thereupon reads the command stored therein and decodes it to activate, in this case, the multi-chunk write line MULT to indicate that a multi-chunk write operation follows. The multi-chunk write line MULT thereupon remains active throughout the multi-chunk write operation.

The register enable circuit 510 next receives the serial protocol operator 202-1 having the bit code "01" which indicates that a chunk address follows. In response, the register enable circuit 510 activates an enable line PADR at a falling edge 212 of the control signal line PD 412, which causes a chunk address 202-2 following the serial protocol operator 202-1 on the serial input bus SI(0:1) 411 to be latched into an address register 501 at time t2. A latch enable circuit 505 coupled to the address register 501, thereupon activates appropriate ones of latch enable lines XL(L), XL(R), YL(1:2), and YR(1:2), to latch the chunk address stored therein into appropriate row and column latches of address latches 503. The chunk address stored in the address latches 503 are then provided over appropriate lines of internal row address lines, AXL(0:13) and AXR(0:13), to row decoders, 401 and 406, and internal column address lines, AYL1(0:3), AYL2(0:3), AYR1(0:3), and AYR2(0:3), to column decoder and sense amplifier circuits 402, 403, 407, and 408.

The register enable circuit 510 next receives the serial protocol operator 202-3 having the bit code "11" which indicates that a chunk of data follows. In response, the register enable circuit 510 activates an enable line PDAT at a falling edge 213 of the control signal line PD 412, which causes a chunk of data 202-4 following the serial protocol operator 202-3 on the serial input bus SI(0:1) 411 to be latched into an appropriate one of the data registers 404, 405, 409, and 410 at time t3. In particular, the latch enable circuit 505 determines the data register in which the chunk of data is to be stored from the two most-significant-bits A(18), A(17) of the chunk address stored in the address register 501, and activates the appropriate one of the data latch enable signals Q(0:3) upon activation of the enable line PDAT. For example, if both address bits A(18) and A(17) are "0", then the data latch enable signal Q(0) may be activated to latch the data into data register 404; if address bit A(18) is "0" and A(17) is "1", then the data latch enable signal Q(1) may be activated to latch the data into data register 405; if address bit A(18) is "1" and A(17) is "0", then the data latch enable signal Q(2) may be activated to latch the data into data register 409; and if both address bits A(18) and A(17) are "1", then the data latch enable signal Q(3) may be activated to latch the data into data register 410. Thus, in this preferred scheme, address bit A(18) indicates whether the data chunk is to be programmed into a left plane comprising quandrants 400-0 and 400-1 which share row decoder 401, or a right plane comprising quadrants 400-2 and 400-3 which share row decoder 406; and address bit A(17) indicates whether the data chunk is to be programmed into a left or right quadrant in that plane.

The register enable circuit 510 next receives address and data information for subsequent data chunks to be concurrently programmed into different ones of the quadrants 400-0 to 400-3, and causes them to be handled in the same fashion as the first chunk address 202-2 and first data chunk 202-4. For example, the first data chunk 202-4 may be latched into the first data register 404 to be programmed into the first quadrant 400-0, a second data chunk 203-4 may be latched into the second data register 405 to be programmed into the second quadrant 400-1, a third data chunk 204-4 may be latched into the third data register 409 to be programmed into the third quadrant 400-2, and a fourth data chunk 205-4 may be latched into the fourth data register 410 to be programmed into the fourth quadrant 400-3.

The register enable circuit 510 then receives the serial protocol operator 206-1 having the bit code "10" which indicates that a command follows. In response, the register enable circuit 510 activates an enable line PCMD at a falling edge 216 of the control signal line PD 412, which causes a program command 206-2 following the serial protocol operator 206-1 on the serial input bus SI(0:1) 411 to be latched into the command register 502 at time t6. The command decoder 504 thereupon reads the command stored therein and decodes it to activate, in this case, a program line PGM. A program enable circuit 506 receives the program line PGM, the multi-chunk program line MS 413, and the most-significant-bit A(18) from the chunk address stored in the address register 501 and activates in response thereof, the program enable lines PGM(0), PGM(1), PGM(2), and PGM(3) provided to the program/verify circuits 454, 455, 459, and 460 to selectively activate their respective program/verify modes of operation.

Figure 6:
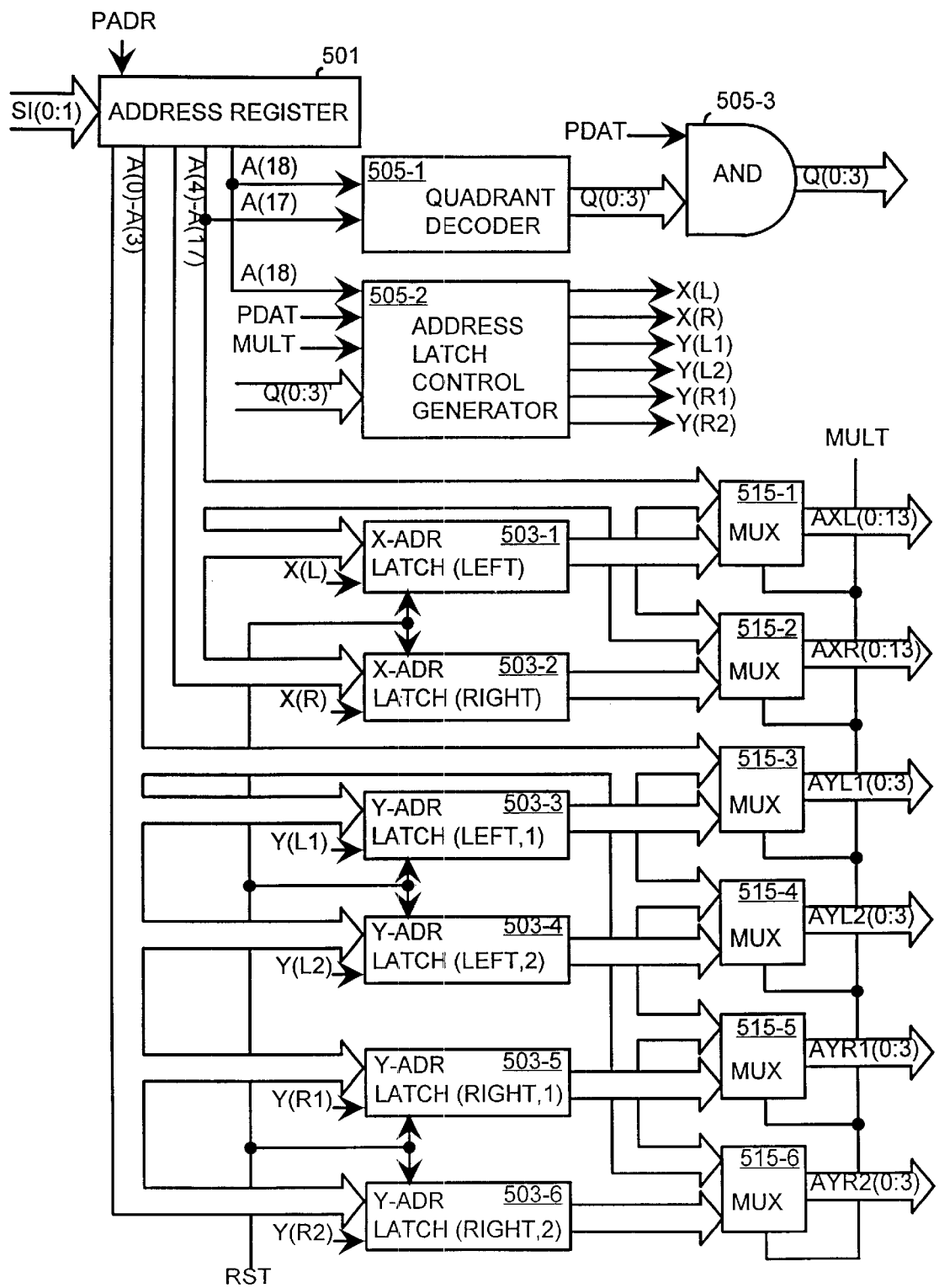
FIG. 6 illustrates, as an example, a block diagram of the address latches, latch enable, and multiplexer of the write control logic circuit of FIG. 5, utilizing aspects of the present invention.

FIG. 6 illustrates, as an example, a block diagram further detailing the address latches 503, the latch enable circuit 505, and a multiplexer circuit 515 of the write control logic 450. Included in the address latches 503 are first and second row address latches, 503-1 and 503-2, for storing row addresses to be decoded respectively by the left and right row decoders, 401 and 406, and first, second, third, and fourth column address latches, 503-3, 503-4, 503-5, and 503-6, for storing column addresses to be decoded respectively by the first, second, third, and fourth column decoder and sense amplifier circuits, 402, 403, 407, and 408. The first and second row address latches, 503-1 and 503-2, are coupled to address bits A(4:17) so that when the first row address latch 503-1 is enabled by activating enable line X(L), the first row address latch 503-1 latches these bits into its contents, and when the second row address latch 503-2 is enabled by activating enable line X(R), the second row address latch 503-2 latches these bits into its contents. In a similar fashion, the first, second, third, and fourth column latches, 503-3 to 503-6, are coupled to address bits A(0:3) of the address register 501 so that when the first column latch 503-3 is enabled by activating enable line Y(L1), the first column latch 503-3 latches these bits into its contents, when the second column latch 503-4 is enabled by activating enable line Y(L2), the second column latch 503-4 latches these bits into its contents, when the third column latch 503-5 is enabled by activating enable line Y(R1), the third column latch 503-5 latches these bits into its contents, and when the fourth column latch 503-6 is enabled by activating enable line Y(R2), the fourth column latch 503-6 latches these bits into its contents. A common reset line RST is provided to each of the row and column latches, 503-1 to 503-6, to reset their contents when the reset line RST is activated by, for example, a microprocessor (not shown) or controller (not shown) which communicates with the EEPROM system 4000 through the serial input and output lines, 411 and 414, and control signal lines, 412 and 413.

The multiplexer circuit 515 includes six multiplexers, 515-1 to 515-6. The multiplexers 515-1 and 515-2 respectively generate the left and right row address lines AXL(0:13) and AXR(0:13) provided to the left and right row decoders 401 and 406, and the multiplexers 515-3 to 515-6 respectively generate the column address lines AYL1(0:3), AYL2(0:3), AYR1(0:3), and AYR2(0:3) provided to the column decoder and sense amplifier circuits 402, 403, 407, and 408. Each of the multiplexers 515-1 and 515-2 has a first set of inputs coupled to address bits A(4:17) of the address-register 501, a second set of inputs coupled to a corresponding one of the row address latches 503-1 and 503-2, and a select input coupled to the multi-chunk write line MULT generated by the command decoder 504, wherein address bits A(4:17) indicate a quadrant row address. Similarly, each of the multiplexers 515-3 to 515-6 has a first set of inputs coupled to address bits A(0:3) of the address register 501, a second set of inputs coupled to a corresponding one of the column address latches 503-3 to 503-6, and a select input coupled to the multi-chunk write line MULT generated by the command decoder 504, wherein address bits A(0:3) indicate a quadrant column address.

When a multi-chunk write operation is being performed, the multi-chunk write line MULT is activated, and the six multiplexers, 515-1 to 515-6, pass their second set of inputs, i.e., the row and column addresses previously latched into their corresponding row and column address latches, 503-1 to 503-6, to their respective row and column decoders via address lines, AXL(0:13), AXR(0:13), AYL1(0:3), AYL2(0:3), AYR1(0:3), and AYR2(0:3). When a multi-chunk write operation is not being performed, the multi-chunk write line MULT is not activated, and the six multiplexers, 515-1 to 515-6, pass their first set of inputs, i.e., the row and column addresses indicated by bits A(4:17) and A(0:3) stored in the address register 501, to their respective row and column decoders via address lines, AXL(0:13), AXR(0:13), AYL1(0:3), AYL2(0:3), AYR1(0:3), and AYR2(0:3).

The latch enable circuit 505 includes a quadrant decoder circuit 505-1, an address latch control generator circuit 505-2, and an AND logic circuit 505-3. The quadrant decoder circuit 505-1 receives the address bits A(18) and A(17) from the address register 501, and activates one of four internal quadrant lines Q(0:3)'. The address latch control generator circuit 505-2 receives the address bit A(18) from the address register 501, the enable line PDAT from the register enable circuit 510, the multi-chunk write line MULT from the command decoder 504, and the internal quadrant lines Q(0:3)' from the quadrant decoder circuit 505-1, and activates appropriate ones of the latch enable lines X(L), X(R), Y(L1), Y(L2), Y(R1), and Y(R2) provided to the row and column address latches, 503-1 to 503-6. The AND logic circuit 505-3 receives the internal quadrant lines Q(0:3)' from the quadrant decoder circuit 505-1 and the enable line PDAT from the register enable circuit 510, and activates appropriate ones of the data latch enable lines Q(0:3) in such a fashion that the data latch enable line Q(0) is only active if the internal quadrant line Q(0)' and the enable line PDAT are both active, the data latch enable line Q(1) is only active if the internal quadrant line Q(1)' and the enable line PDAT are both active, the data latch enable line Q(2) is only active if the internal quadrant line Q(2)' and the enable line PDAT are both active, and the data latch enable line Q(0) is only active if the internal quadrant line Q(0)' and the enable line PDAT are both active.

Figure 7:
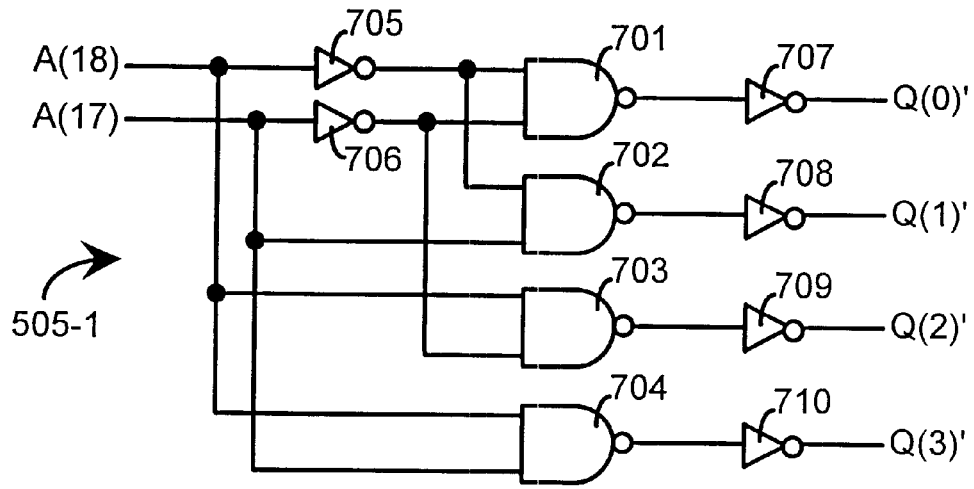
FIG. 7 illustrates, as an example, a logic diagram of a quadrant decoder of the latch enable circuit of FIG. 5, utilizing aspects of the present invention.

FIG. 7 illustrates, as an example, a logic diagram of the quadrant decoder 505-1. Included in the quadrant decoder 505-1 are four NAND gates 701 to 704, and six inverters 705 to 710. The inverter 705 has an input coupled to the address bit A(18) of the address register 501, and an output coupled to first inputs of the NAND gates 701 and 702. The inverter 706 has an input coupled to the address bit A(17) of the address register 501, and an output coupled to second inputs of the NAND gates 701 and 703. The address bit A(18) is directly coupled to first inputs of the NAND gates 703 and 704, and the address bit A(17) is directly coupled to second inputs of the NAND gates 702 and 704. The inverters 707 to 710 have inputs respectively coupled to corresponding outputs of the NAND gates 701 to 704, and outputs respectively providing the four internal quadrant lines Q(0:3)'. Accordingly, when the address bits A(18) and A(17) are both "0", the internal quadrant line Q(0)' corresponding to the quadrant 400-0 and data register 404 is activated, when the address bit A(18) is "0" and the address bit A(17) is "1", the internal quadrant line Q(1)' corresponding to the quadrant 400-1 and data register 405 is activated, when the address bit A(18) is "1" and the address bit A(17) is "0", the internal quadrant line Q(2)' corresponding to the quadrant 400-2 and data register 409 is activated, and when the address bits A(18) and A(17) are both "1", the internal quadrant line Q(3)' corresponding to the quadrant 400-3 and data register 410 is activated.

Figure 8:
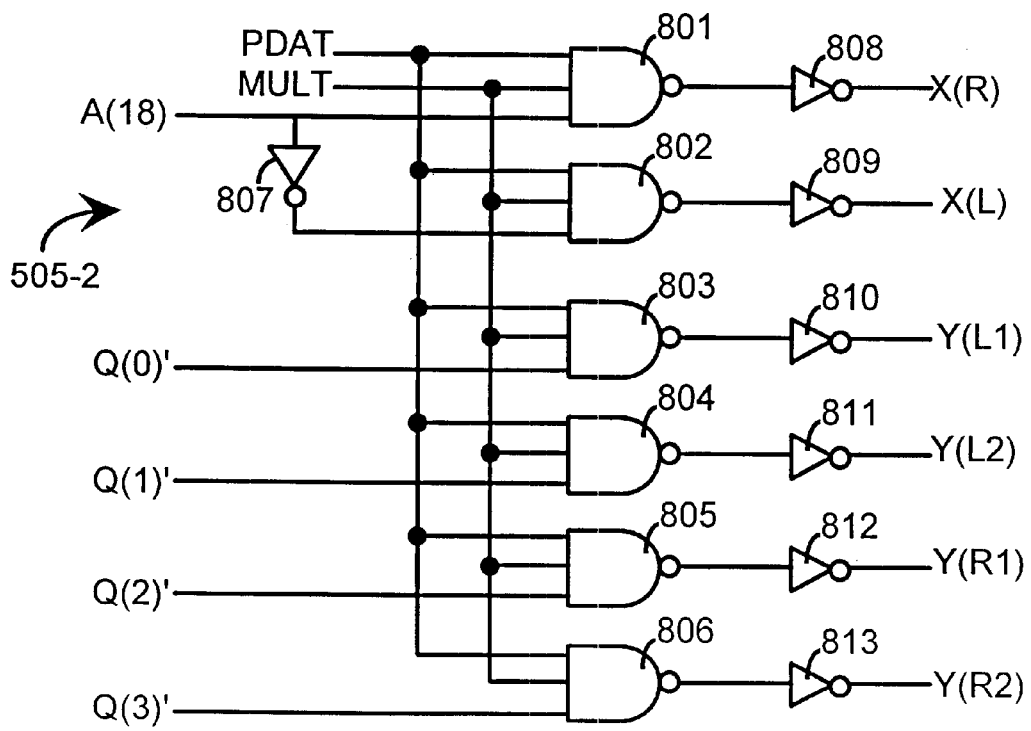
FIG. 8 illustrates, as an example, a logic diagram of an address latch control generator circuit of the latch enable circuit of FIG. 5, utilizing aspects of the present invention.

FIG. 8 illustrates, as an example, a logic diagram of the address latch control generator 505-2. Included in the address latch control generator 505-2 are six NAND gates, 801 to 806, and seven inverters, 807 to 813. Each of the six NAND gates, 801 to 806, has a first input coupled to the enable line PDAT provided by the register enable circuit 510, and a second input coupled to the multi-chunk write line MULT provided by the command decoder circuit 504. In addition, the NAND gate 801 has a third input coupled to the address bit A(18) of the address register 501, the NAND gate 802 has a third input coupled through the inverter 807 to the address bit A(18) of the address register 501, and the NAND gates 803 to 806 each have third inputs coupled to corresponding ones of the internal quadrant lines Q(0:3)' provided by the quadrant decoder circuit 505-1. The inverters 808 to 813 have inputs respectively coupled to corresponding outputs of the NAND gates 801 to 806, and outputs activating appropriate ones of the row and column latch enable lines X(R), X(L), Y(L1), Y(L2), Y(R1), and Y(R2). Accordingly, the row and column latch enable lines X(R), X(L), Y(L1), Y(L2), Y(R1), and Y(R2) are only activated during a multi-chunk write operation, i.e., while the multi-chunk write line MULT is activated, and while the enable line PDAT is activated. Under these conditions, one or the other of the latch enable lines X(L) and X(R) is activated, depending upon which plane corresponds to the address stored in the address register 501, and one of the latch enable lines Y(L1), Y(L2), Y(R1), and Y(R2) is activated, depending upon which quadrant corresponds to the address stored in the address register 501.

Figure 9:
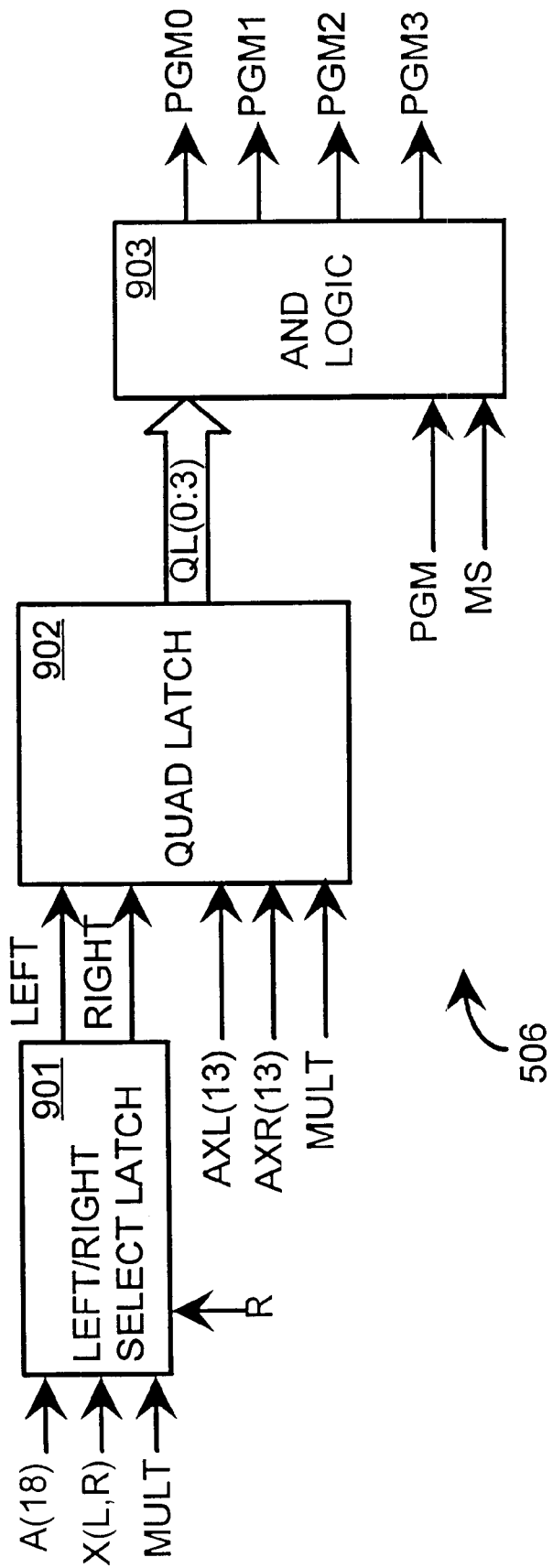
FIG. 9 illustrates, as an example, a block diagram of a program enable circuit of the write control logic circuit of FIG. 5, utilizing aspects of the present invention.
Figure 10:
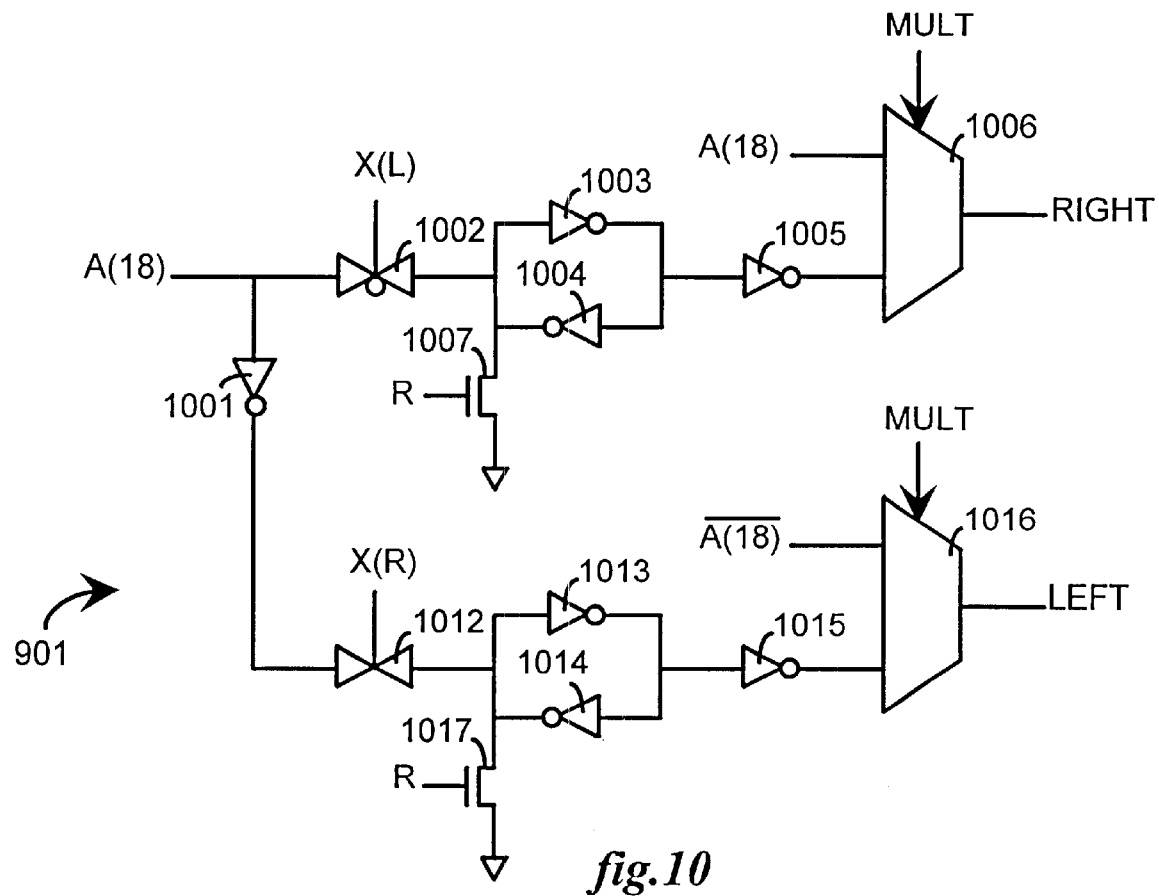
FIG. 10 illustrates, as an example, a logic diagram of a left/right plane select latch of the program enable circuit of FIG. 9, utilizing aspects of the present invention.
Figure 11:
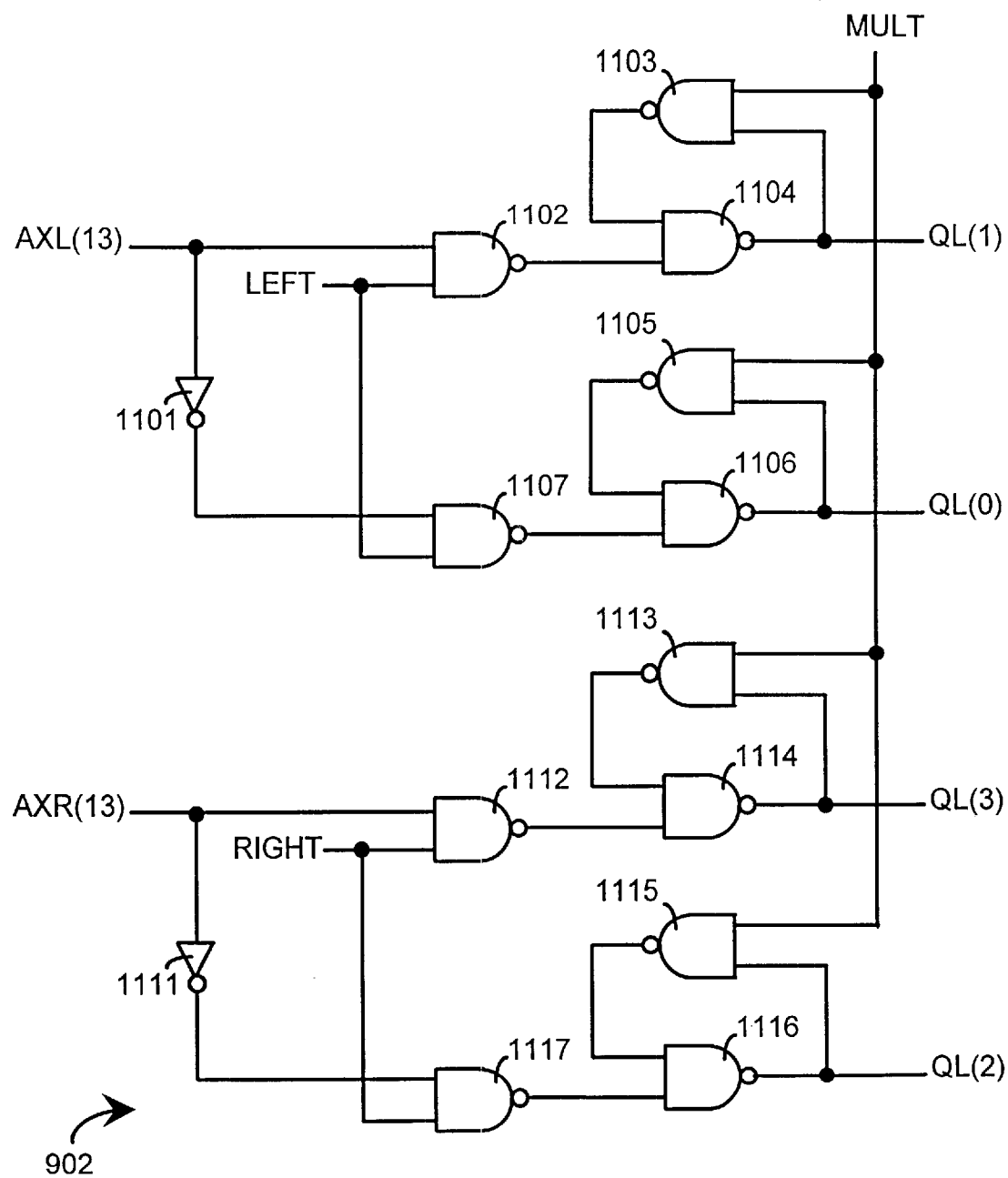
FIG. 11 illustrates, as an example, a logic diagram of a quadrant latch of the program enable circuit of FIG. 9, utilizing aspects of the present invention.

FIG. 9 illustrates, as an example, a block diagram further detailing the program enable circuit 506. Included in the program enable circuit 506 are a left/right select switch circuit 901, a quad latch circuit 902, and an AND logic circuit 903. The left/right select switch circuit 901, as detailed in FIG. 10, receives the address bit A(18) from the address register 501, the latch enable lines X(L) and X(R) from the address latch control generator circuit 505-2, and the multi-chunk write line MULT from the command decoder circuit 504, and activates one or both of left and right plane lines, LEFT and RIGHT. The activated left and right plane lines, LEFT and RIGHT, thereupon remain activated until a reset line R provided to a reset input of the left/right select switch circuit 901 is activated. The quad latch circuit 902, as detailed in FIG. 11, receives the left and right plane lines, LEFT and RIGHT, from the left/right select switch circuit 901, the internal row address lines AXL(13) and AXR(13) from the multiplexers 515-1 and 515-2, and the multi-chunk write line MULT from the command decoder circuit 504, and activates appropriate ones of quadrant latch lines QL(0:3) such that the quadrant latch line QL(0) is activated if data is to be programmed into the quadrant 400-0 during the multi-chunk write operation, the quadrant latch line QL(1) is activated if data is to be programmed into the quadrant 400-1 during the multi-chunk write operation, the quadrant latch line QL(2) is activated if data is to be programmed into the quadrant 400-2 during the multi-chunk write operation, and the quadrant latch line QL(3) is activated if data is to be programmed into the quadrant 400-3 during the multi-chunk write operation.

Figure 12:
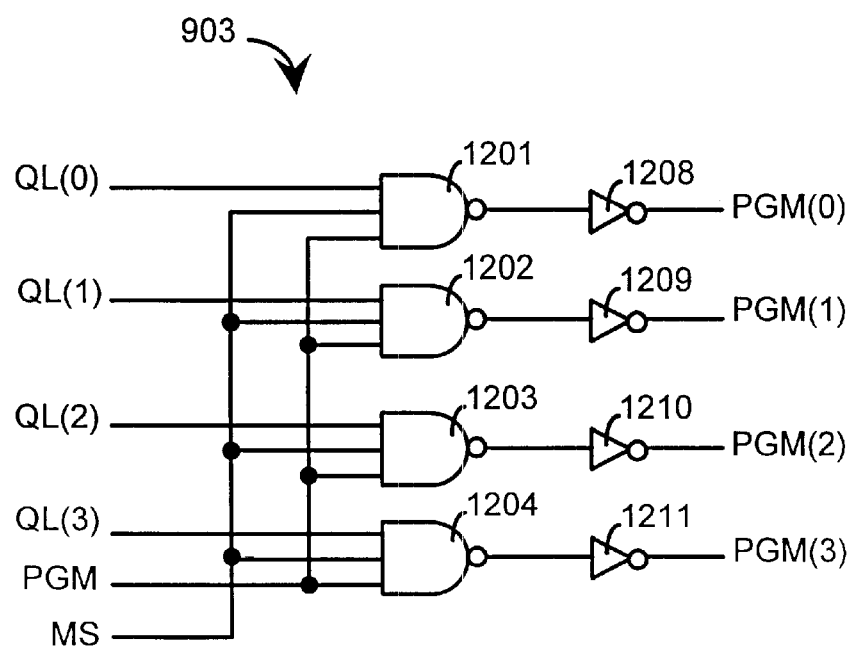
FIG. 12 illustrates, as an example, a logic diagram of AND logic of the program enable circuit of FIG. 9, utilizing aspects of the present invention.

The AND logic circuit 903, as detailed in FIG. 12, receives the quadrant latch lines QL(0:3) from the quad latch circuit 902, the enable line PGM from the command decoder circuit 504, and the multi-chunk program line 413 provided, for example, by a microprocessor (not shown) or controller (not shown) which communicates with the EEPROM system 4000 through the serial input and output lines, 411 and 414, and control signal lines, 412 and 413, and activates appropriate ones of the program enable lines PGM(O), PGM(1), PGM(2), and PGM(3) such that program enable line PGM(O) is activated only if data is to be programmed into quadrant 400-0 and both the program enable line PGM and the multi-chunk program line are active, program enable line PGM(1) is activated only if data is to be programmed into quadrant 400-1 and both the program enable line PGM and the multi-chunk program line are active, program enable line PGM(2) is activated only if data is to be programmed into quadrant 400-2 and both the program enable line PGM and the multi-chunk program line are active, and program enable line PGM(3) is activated only if data is to be programmed into quadrant 400-3 and both the program enable line PGM and the multi-chunk program line are active.

Although the various aspects of the present invention have been described with respect to a preferred embodiment, it will be understood that the invention is entitled to full protection within the full scope of the appended claims.

What is claimed is:

1. A circuit for concurrently writing data into selected memory locations of a plurality of EEPROM subarrays, comprising:

a plurality of address latches, a plurality of data registers individually coupled to a corresponding one of said plurality of EEPROM subarrays, means for storing subarray addresses into selected ones of said plurality of address latches, and storing data to be written into subarray locations indicated by said subarray addresses, into selected ones of said plurality of data registers, and means for concurrently writing said data stored in said plurality of data registers into the subarray locations indicated by said subarray addresses stored in said plurality of address latches;

wherein individual ones of said plurality of subarray addresses are coded such that a first plurality of bits indicates the subarray in which the subarray location indicated by said subarray address resides, and said storing means includes means for decoding said first plurality of bits to generate a signal to enable the data register coupled to the subarray indicated by said first plurality of bits.

2. The circuit as recited in claim 1, wherein individual ones of said plurality of subarray addresses are further coded such that a second plurality of bits indicates a row address and a third plurality of bits indicates a column address of the subarray indicated by said first plurality of bits, and said plurality of address latches include a plurality of row address latches and a plurality of column address latches for respectively latching said row addresses indicated by said second plurality of bits and said column addresses indicated by said third plurality of bits.

3. The circuit as recited in claim 2, wherein said storing means includes means for generating a plurality of signals to enable the pluralities of row and column address latches for storing said row and column addresses indicated by said second and third plurality of bits.

4. The circuit as recited in claim 3, wherein said plurality of column address latches are individually dedicated to storing column addresses of a corresponding one of said plurality of EEPROM subarrays.

5. The circuit as recited in claim 4, wherein said plurality of row address latches are individually dedicated to storing row addresses of a corresponding pair of said plurality of EEPROM subarrays.

6. The circuit as recited in claim 1, wherein said plurality of address latches include a row address latch, and said plurality of EEPROM subarrays include a pair of EEPROM subarrays sharing said row address latch.

7. A method of programming data into a memory formed of a plurality of sub-arrays of non-volatile data storage elements, comprising:

receiving a plurality of chunks of data, the chunks of data individually containing a plurality of bytes of the data, temporarily storing the received plurality of chunks of data in a corresponding plurality of data registers, wherein each of the sub-arrays has a unique one of the plurality of data registers associated with it, receiving addresses of data storage elements within each of more than one of the plurality of sub-arrays in which the received plurality of data chunks are being written, and concurrently writing the stored plurality of data chunks from the data registers into storage elements in the sub-arrays that are designated by the received addresses, whereby the plurality of data chunks are written in parallel;

wherein the plurality of data chunks are sequentially received and temporarily stored in the plurality of data registers, one data chunk after the other.

8. The programming method of claim 7, additionally comprising temporarily storing the data storage element addresses in a corresponding plurality of address registers, wherein each of the sub-arrays has a unique one of the plurality of address registers associated it.

9. The programming method of claim 8, wherein the plurality of addresses are sequentially received and temporarily stored, one address after the other.

10. The programming method of any one of claims 7, 8–9, wherein the non-volatile storage elements include floating gates within flash EEPROM memory cells.

11. The programming method of claim 10, wherein writing the stored data chunks into the sub-arrays includes programming the individual storage elements of the sub-arrays into more than two programmable states in order to store more than one bit of data per storage element.

12. The programming method of claim 7, wherein the plurality of sub-arrays includes exactly four sub-arrays.

* * * * *